(12) United States Patent
Bendsen

(10) Patent No.: US 8,923,789 B2
(45) Date of Patent: Dec. 30, 2014

(54) METHOD OF DIMINISHING THE MINIMUM RANGE OF OPERATION OF A COMMUNICATION LINK

(75) Inventor: Henrik Bendsen, Smørum (DK)

(73) Assignee: Oticon A/S, Smorum (DK)

( * ) Notice: Subject to any disclaimer, the term of this patent is extended or adjusted under 35 U.S.C. 154(b) by 0 days.

(21) Appl. No.: 13/556,870

(22) Filed: Jul. 24, 2012

(65) Prior Publication Data

US 2013/0029624 A1    Jan. 31, 2013

Related U.S. Application Data

(60) Provisional application No. 61/511,563, filed on Jul. 26, 2011.

(30) Foreign Application Priority Data

Jul. 26, 2011    (EP) .................................... 11175282

(51) Int. Cl.
| | |
|---|---|
| *H04B 1/18* | (2006.01) |
| *H03F 1/56* | (2006.01) |
| *H03G 3/30* | (2006.01) |
| *H03G 3/00* | (2006.01) |
| *H03F 3/189* | (2006.01) |

(52) U.S. Cl.
CPC .......... *H03F 1/565* (2013.01); *H03F 2200/252* (2013.01); *H03F 1/56* (2013.01); *H03G 3/3052* (2013.01); *H03F 2200/222* (2013.01); *H03G 3/001* (2013.01); *H03F 2200/294* (2013.01); *H03F 2200/451* (2013.01); *H03F 2200/249* (2013.01); *H03F 3/189* (2013.01)
USPC ..................................... 455/193.1; 455/234.1

(58) Field of Classification Search
USPC .......... 455/193.1, 234.2, 241.1, 247.1, 248.1, 455/249.1, 250.1, 251.1, 253.2, 232.1
See application file for complete search history.

(56) References Cited

U.S. PATENT DOCUMENTS

| | | | |
|---|---|---|---|
| 5,144,675 A | 9/1992 | Killion et al. | |
| 7,567,126 B2* | 7/2009 | Arai | 330/285 |
| 7,831,219 B2* | 11/2010 | Heuermann et al. | 455/107 |
| 7,853,227 B2* | 12/2010 | Stevenson et al. | 455/232.1 |

(Continued)

FOREIGN PATENT DOCUMENTS

| | | |
|---|---|---|
| EP | 1460769 A1 | 9/2004 |
| EP | 1981253 A1 | 10/2008 |

(Continued)

*Primary Examiner* — Blane J Jackson
(74) *Attorney, Agent, or Firm* — Birch, Stewart, Kolasch & Birch, LLP

(57) ABSTRACT

A portable electronic device comprises a wireless receiver unit for receiving a wireless signal from a transmitting device, the wireless receiver unit comprising an antenna receiving an electromagnetic signal and providing a received electric input signal, and a receiver providing a recovered electric signal from the received electric input signal, and an impedance matching circuit matching the electric impedance of the antenna to the receiver, the receiver comprising a gain stage comprising an Automatic Gain Control unit automatically determining an AGC-gain value for application to an AGC-input signal to provide an appropriate signal level when the level of said AGC input signal is in a range between a minimum and a maximum signal level corresponding to maximum and minimum AGC-gain values, respectively. The portable device further comprises a control unit receiving the AGC-gain value and providing a control signal depending on said AGC-gain value to the impedance matching circuit.

17 Claims, 3 Drawing Sheets

(56) References Cited

U.S. PATENT DOCUMENTS

| | | | |
|---|---|---|---|
| 7,933,574 B2* | 4/2011 | Rofougaran et al. | 455/248.1 |
| 8,041,227 B2* | 10/2011 | Holcombe et al. | 398/138 |
| 8,078,126 B2* | 12/2011 | Park et al. | 455/232.1 |
| 8,447,225 B2* | 5/2013 | Kwon et al. | 455/3.01 |
| 2002/0048109 A1* | 4/2002 | Chaiken et al. | 360/67 |
| 2004/0080372 A1 | 4/2004 | Chen | |
| 2005/0118971 A1* | 6/2005 | Arai et al. | 455/232.1 |
| 2009/0130991 A1 | 5/2009 | Rofougaran et al. | |
| 2012/0224732 A1* | 9/2012 | Secall et al. | 381/315 |

FOREIGN PATENT DOCUMENTS

| | | |
|---|---|---|
| EP | 2211579 A1 | 7/2010 |
| WO | WO 03/081947 A1 | 10/2003 |
| WO | WO 2009/135872 A1 | 11/2009 |

\* cited by examiner

METHOD OF DIMINISHING THE MINIMUM RANGE OF OPERATION OF A COMMUNICATION LINK

CROSS REFERENCE TO RELATED APPLICATIONS

This nonprovisional application claims priority under 35 U.S.C. 119(a) to Patent Application No. 11175282.0 filed in Europe, on Jul. 26, 2011 and under 35 U.S.C. 119(e) to U.S. Provisional Application No. 61/511,563 filed on Jul. 26, 2011. The entire contents of all of the above applications are hereby incorporated by reference into the present application.

TECHNICAL FIELD

The present application relates to wireless communication between mobile devices, in particular to the minimum-distance problem in a communication link. The disclosure relates specifically to a portable electronic device comprising a wireless receiver unit for receiving a wireless signal from a transmitting device, the wireless receiver unit comprising an antenna, a receiver, and an impedance matching circuit for matching the electric impedance of the antenna to the receiver, the receiver comprising a gain stage comprising an Automatic Gain Control unit (AGC).

The application furthermore relates to a method of operating a wireless receiver unit, to the use of a portable electronic device and to a communication system comprising a portable electronic device.

The application further relates to a data processing system comprising a processor and program code means for causing the processor to perform at least some of the steps of the method and to a computer readable medium storing the program code means.

The disclosure may e.g. be useful in applications involving portable electronic devices capable of establishing a wireless communication link to other devices, e.g. listening devices, such as hearing aids.

BACKGROUND

A typical communication link has a specified maximum and minimum operating distance between transmitter and receiver. For mobile devices, such as portable communication devices or listening devices, e.g. hearing instruments, that are adapted to communicate with each other via a wireless link, it may happen that a transmitting device and a receiving device are located (intentionally or un-intentionally) out of the specified operating range.

A communication system comprising first and second communication devices comprising a dynamic regulation scheme for adapting transmit power to the signal quality of the link established between the devices is e.g. disclosed in EP 2 211 579 A1. In an embodiment, the system is adapted to use the dynamic power regulation to implement a partial power down of the system, when the two communications devices are located outside the specified operating range (i.e. either too close to each other or too far from each other). When the two devices are too close to each other, the receiver 'saturates' because it is not able to handle the received input level.

US 2009/0130991 A1 describes a method of matching the input of an LNA to an antenna over a range of frequencies by maximizing field strength using an adjustable antenna matching network. US 2004/0080372 A1 describes a high frequency amplifier for a mobile phone comprising variable capacitors and resistors at its input and output matching circuits, wherein the gain and frequency response can be automatically tuned to the avoid impact of impedance variation of the lead frame of the mobile phone or resulting from the manufacturing process.

SUMMARY

The present invention may be used in connection with any wireless link, comprising an antenna for receiving an electromagnetic signal and providing a received electric signal and a transceiver for amplifying the received electric signal and possibly extracting an information signal, e.g. an audio signal, from the received electric signal. Typically the transceiver comprises a gain stage for amplifying an input signal and providing an amplified output signal, but no attenuation stage for attenuating an input signal.

An object of the present application is to provide a scheme for improving flexibility in the acceptable range of operation of a wireless link. A further object is to decrease a minimum operating distance between a transmitting and a receiving device.

Objects of the application are achieved by the invention described in the accompanying claims and as described in the following.

A Portable Electronic Device:

In an aspect of the present application, an object of the application is achieved by a portable electronic device comprising a wireless receiver unit for receiving a wireless signal from a transmitting device, the wireless receiver unit comprising an antenna for receiving an electromagnetic signal and providing a received electric input signal, and a receiver for providing a recovered electric signal from the received electric input signal, and an impedance matching circuit for matching the electric impedance of the antenna to the receiver, the receiver comprising a gain stage comprising an Automatic Gain Control unit for automatically determining an AGC-gain value for application to an AGC-input signal to provide an appropriate signal level of the recovered electric signal when the level of said AGC input signal is in a range between a minimum signal level and a maximum signal level corresponding to maximum and minimum AGC-gain values, respectively, wherein the portable electronic device further comprises a control unit receiving said AGC-gain value and providing a control signal depending on said AGC-gain value to said impedance matching circuit, and wherein the control unit is adapted to change the impedance matching of the antenna to the receiver based on the control signal.

This has the advantage of enhancing the dynamic range of the wireless receiver, e.g. allowing a smaller minimum distance between transmitter and receiver.

In the present context, the term 'an electromagnetic signal' is taken to mean a wireless signal comprising an electric field component and a magnetic field component (based on electromagnetic radiation) or an electric or magnetic field component alone (based on an electric or magnetic coupling, respectively, between appropriate capacitive and inductive components, respectively).

The variable gain of the gain stage allows the receiver itself to set the gain to an appropriate value, ensuring the optimum signal level for the succeeding receiver circuits. This is known as Automatic Gain Control. (AGC).

It should be understood that the purpose of the impedance matching circuit is to provide that the received electric signal has a level within the dynamic range of the following gain stage. This is achieved by dynamically varying the degree of matching of the electric impedance of the antenna to the receiver (gain stage), thereby leaving the signal un-attenuated (optimal match), if the level of the received electric signal is within the dynamic range of the gain stage, and attenuate (decreased match (increased mis-match)) the signal (detune the antenna), if the level of the received electric signal is too large (i.e. so that the gain of the gain stage cannot be sufficiently decreased to bring the level of the received electric signal within the dynamic range of the gain stage). The principle of the present disclosure is schematically illustrated in FIG. 5.

The control signal to the impedance matching circuit (for 'matching' the electric impedance of the antenna to the receiver) is thus intended to control the degree of match (or mis-match) of the impedance matching circuit (between the antenna and receiver impedances) to allow an attenuation of the received electric signal, in case its level is larger than the upper limit of the dynamic range of the gain stage.

In general, the gain stage is able to apply a gain $G_A$ to an input signal between a minimum value $G_{Amin}$ and a maximum value $G_{Amax}$. Correspondingly, the Automatic Gain Control unit is able to apply a gain $G_{AGC}$ to an input signal between a minimum value $G_{AGCmin}$ and a maximum value $G_{AGCmax}$. In a particular embodiment, the Automatic Gain Control unit is adapted to amplify an input signal but not to attenuate the input signal (i.e. $G_{AGCmax} \geq 1$). In other words, the AGC unit is not capable of reducing the input level (only to increase it). Alternatively, the minimum gain value $G_{AGCmin}$ of the AGC unit may be <1.

The impedance matching circuit is located between the antenna and the first gain stage to (if necessary) be able to attenuate the signal before it is fed to the gain stage.

In a particular embodiment, the control unit is adapted to decrease the (degree of) impedance matching of the impedance matching circuit when said AGC-gain value is below a predefined minimum threshold AGC-gain value (thereby decreasing the strength of the signal from the antenna). In a particular embodiment, the control unit is adapted to increase the (degree of) impedance matching of the impedance matching circuit when said AGC-gain value is above a predefined maximum threshold AGC-gain value (thereby increasing the strength of the signal from the antenna). In a particular embodiment, the Automatic Gain Control unit is adapted to provide said AGC-gain values in steps between a minimum and a maximum value.

The impedance matching circuit is preferably passive. In a particular embodiment, the impedance matching circuit comprises a variable capacitance. In a particular embodiment, the impedance matching circuit comprises a variable resistance. In a particular embodiment, the impedance matching circuit comprises a variable inductance. In an embodiment, the impedance matching circuit comprises one or more of a variable capacitance, a variable resistance and a variable inductance.

In general, the wireless link established by the transmitter and receiver parts can be of any type. In a near-field communication link for example (e.g. an inductive link), the signal strength decreases with $L^3$, where L is the distance between transmitter and receiver. In a far-field communication link, the signal strength correspondingly decreases with $L^2$. In particular for a communication link based on near-field communication (e.g. an inductive link), the signal strength is highly dependent on the distance between transmitter and receiver. The maximum transmit power of the link determines the maximum transmit range. If e.g. a transmitter is adapted to always work at maximum power, a very large difference between received power is experienced between the maximum and the minimum range of operation.

In an embodiment, the wireless link is a link based on near-field communication, e.g. an inductive link based on an inductive coupling between antenna coils of the transmitter and receiver parts of the first and second communication devices, respectively. In a particular embodiment, the antenna comprises an inductance, e.g. an inductance coil. In a particular embodiment, the wireless link is a link based on a capacitive coupling between capacitive elements of the transmitter and receiver parts of the first and second communication devices, respectively. In an embodiment, the antenna comprises a capacitance, e.g. a patch.

In another embodiment, the wireless link is based on far-field, electromagnetic radiation.

In an embodiment, the communication via the wireless link is arranged according to a specific modulation scheme, e.g. an analogue modulation scheme, such as FM (frequency modulation) or AM (amplitude modulation) or PM (phase modulation), or a digital modulation scheme, such as ASK (amplitude shift keying), e.g. On-Off keying, FSK (frequency shift keying), PSK (phase shift keying) or QAM (quadrature amplitude modulation).

In a particular embodiment, the portable electronic device is adapted to provide that the change of the impedance matching of the antenna to the receiver is performed in one or more steps controlled by said control signal from the control unit. This is e.g. relevant (to be able to sequentially attenuate electric input signal received from the antenna), in case the receiver is saturated by the two devices being located close to each other.

In a particular embodiment, the portable electronic device comprises a listening device such as a hearing aid.

In a particular embodiment, the gain stage comprises a first, fixed (pre-amplifying) gain stage and a second, variable (AGC) gain stage. When transmitter and receiver are located at a distance below the (normal) minimum operating distance, the signal strength is too high for the receiver's first gain stage to handle (saturation), but the first gain stage is fixed and cannot attenuate the incoming signal. In this case, a detuning of the antenna (by changing the impedance matching circuit) as proposed by the present disclosure may bring the signal strength into the receiver's operating range (by attenuating the signal).

In an embodiment, the portable electronic device comprises a local energy source, e.g. a battery, e.g. a rechargeable battery. In an embodiment, the portable electronic device is a low power device. The term 'low power device' is in the present context taken to mean a device whose energy budget is restricted, e.g. because it is a portable device, e.g. comprising an energy source (e.g. of limited size, e.g. with a maximum capacity of 1000 mAh, such as 500 mAh), which—without being exchanged or recharged—is of limited duration (the limited duration being e.g. of the order of hours or days, e.g. max. 1 or 3 or 7 or 10 days (during normal operation of the device).

In an embodiment, the portable electronic device is adapted to provide a frequency dependent gain to compensate for a hearing loss of a user. In an embodiment, the portable electronic device comprises a signal processing unit for enhancing the input signals and providing a processed output signal. Various aspects of digital hearing aids are described in [Schaub; 2008].

In an embodiment, the portable electronic device comprises an output transducer for converting an electric signal to a stimulus perceived by the user as an acoustic signal. In an embodiment, the output transducer comprises a number of electrodes of a cochlear implant or a vibrator of a bone conducting hearing device. In an embodiment, the output transducer comprises a receiver (speaker) for providing the stimulus as an acoustic signal to the user.

In an embodiment, the portable electronic device comprises a (possibly standardized) electric interface (e.g. in the form of a connector) for receiving a wired direct electric input signal from another device, e.g. a communication device or another portable electronic device.

In an embodiment, the receiver of the portable electronic device comprises demodulation circuitry for demodulating the received electric input signal to provide an electric input signal representing an information signal (e.g. an audio signal and/or a control signal e.g. for setting an operational parameter (e.g. volume) and/or a processing parameter of the portable electronic device).

In an embodiment, the portable electronic device and/or the communication device comprises an electrically small antenna. An 'electrically small antenna' is in the present context taken to mean that the spatial extension of the antenna (e.g. the maximum physical dimension in any direction) is much smaller than the wavelength $\lambda_{TX}$ of the transmitted electric signal. In an embodiment, the spatial extension of the antenna is a factor of 10, or 50 or 100 or more, or a factor of 1 000 or more, smaller than the carrier wavelength $\lambda_{TX}$ of the transmitted signal.

In an embodiment, the communication between the portable electronic device and the other device is in the base band (audio frequency range, e.g. between 0 and 20 kHz). Preferably, communication between the portable electronic device and the other device is based on some sort of modulation at frequencies above 100 kHz. Preferably, frequencies used to establish communication between the portable electronic device and the other device is below 50 GHz, e.g. located in a range from 100 kHz to 50 MHz (such as in the range from 1 MHz to 10 MHz), or in the range from 50 MHz to 50 GHz.

In an embodiment, the portable electronic device comprises a forward path or signal path between an input transducer (microphone system and/or direct electric input (e.g. a wireless receiver)) and an output transducer. In an embodiment, the signal processing unit is located in the forward path. In an embodiment, the signal processing unit is adapted to provide a frequency dependent gain according to a user's particular needs. In an embodiment, the portable electronic device comprises an analysis path comprising functional components for analyzing the input signal (e.g. determining a level, a modulation, a type of signal, an acoustic feedback estimate, etc.). In an embodiment, some or all signal processing of the analysis path and/or the signal path is conducted in the frequency domain. In an embodiment, some or all signal processing of the analysis path and/or the signal path is conducted in the time domain. In an embodiment, the portable electronic device comprises an acoustic (and/or mechanical) feedback suppression system. In an embodiment, the portable electronic device further comprises other relevant functionality for the application in question, e.g. compression, noise reduction, etc.

In an embodiment, the portable electronic device has a maximum outer dimension of the order of 0.15 m (e.g. a handheld mobile telephone). In an embodiment, the portable electronic device has a maximum outer dimension of the order of 0.08 m (e.g. a head set). In an embodiment, the portable electronic device has a maximum outer dimension of the order of 0.04 m (e.g. a hearing instrument).

In an embodiment, the portable electronic device comprises a level detector (LD) for determining the level of an input signal (e.g. on a band level and/or of the full (wide band) signal). Level detection in hearing aids is e.g. described in WO 03/081947 A1 or U.S. Pat. No. 5,144,675.

Use:

In an aspect, use of a portable communication device as described above, in the 'detailed description of embodiments' and in the claims, is moreover provided. In an embodiment, use in a listening devices, such as a hearing aid or a headset, is provided.

A Method:

In an aspect, a method of operating a wireless receiver unit for receiving a wireless signal from a transmitting device, the wireless receiver unit comprising an antenna for receiving an electromagnetic signal and providing a received electric input signal, and a receiver for providing a recovered electric signal from the received electric input signal, and an impedance matching circuit for matching the electric impedance of the antenna to the receiver is furthermore provided by the present application. The method comprises a) automatically determining an AGC-gain value in the receiver for application to an AGC-input signal to provide an appropriate signal level of the recovered electric signal when the level of said AGC input signal is in a range between a minimum signal level and a maximum signal level corresponding to maximum and minimum AGC-gain values, respectively;

b) changing the impedance matching of the antenna to the receiver in the impedance matching circuit based on the AGC-gain value.

It is intended that the structural features of the device described above, in the 'detailed description of embodiments' and in the claims can be combined with the method, when appropriately substituted by a corresponding process and vice versa. Embodiments of the method have the same advantages as the corresponding devices.

A Computer Readable Medium:

In an aspect, a tangible computer-readable medium storing a computer program comprising program code means for causing a data processing system to perform at least some (such as a majority or all) of the steps of the method described above, in the 'detailed description of embodiments' and in the claims, when said computer program is executed on the data processing system is furthermore provided by the present application. In addition to being stored on a tangible medium such as diskettes, CD-ROM-, DVD-, or hard disk media, or any other machine readable medium, the computer program can also be transmitted via a transmission medium such as a wired or wireless link or a network, e.g. the Internet, and loaded into a data processing system for being executed at a location different from that of the tangible medium.

A Data Processing System:

In an aspect, a data processing system comprising a processor and program code means for causing the processor to perform at least some (such as a majority or all) of the steps of the method described above, in the 'detailed description of embodiments' and in the claims is furthermore provided by the present application.

A Communication System:

In a further aspect, a communication system comprising a portable electronic device as described above, in the 'detailed description of embodiments' and in the claims AND a transmitting device is furthermore provided, the portable electronic device and a transmitting device being adapted to establish a wireless communication link between them at least allowing a signal to be transmitted from the transmitting device to the portable electronic device. In an embodiment, the wireless communication link is one-way.

In a particular embodiment, the communication system is adapted to provide that the wireless link is based on inductive coupling between respective antenna coils of the transmitting device and the portable electronic device.

In an embodiment, the communication link between the portable electronic device and the transmitting device is adapted to provide that information (e.g. control and status signals, possibly audio signals) can be exchanged or forwarded from one to the other (bidirectionally).

In an embodiment, the transmitting device is an audio gateway device adapted for receiving a multitude of audio signals (e.g. from an entertainment device, e.g. a TV or a music player, a telephone apparatus, e.g. a mobile telephone or a computer, e.g. a PC) and adapted for selecting and/or combining an appropriate one of the received audio signals (or combination of signals) for transmission to the portable electronic device. In an embodiment, the transmitting device is an entertainment device, e.g. comprising a TV or video display unit. In an embodiment, the system is specifically adapted for transmitting and receiving audio via the wireless communication link.

In an embodiment, the transmitting device is another listening device. In an embodiment, the communication system comprises two listening devices adapted to implement a binaural listening system, e.g. a binaural hearing aid system.

Further objects of the application are achieved by the embodiments defined in the dependent claims and in the detailed description of the invention.

As used herein, the singular forms "a," "an," and "the" are intended to include the plural forms as well (i.e. to have the meaning "at least one"), unless expressly stated otherwise. It will be further understood that the terms "includes," "comprises," "including," and/or "comprising," when used in this specification, specify the presence of stated features, integers, steps, operations, elements, and/or components, but do not preclude the presence or addition of one or more other features, integers, steps, operations, elements, components, and/or groups thereof. It will also be understood that when an element is referred to as being "connected" or "coupled" to another element, it can be directly connected or coupled to the other element or intervening elements may be present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

BRIEF DESCRIPTION OF DRAWINGS

The disclosure will be explained more fully below in connection with a preferred embodiment and with reference to the drawings in which.

The figures are schematic and simplified for clarity, and they just show details which are essential to the understanding of the disclosure, while other details are left out.

Further scope of applicability of the present disclosure will become apparent from the detailed description given hereinafter. However, it should be understood that the detailed description and specific examples, while indicating preferred embodiments of the disclosure, are given by way of illustration only. Other embodiments may become apparent to those skilled in the art from the following detailed description.

DETAILED DESCRIPTION OF EMBODIMENTS

The idea is to monitor the incoming signal strength on an AGC of a wireless receiver and switch the tank Q to a lower value (=less sensitive receiver) before the signal overloads the input stage of the receiver, and, of course, reversing this step when the signal gets lower again. In an embodiment, the AGC unit has a gain control output for controlling the gain of a variable amplifier. The gain control output may be an analogue signal or a digital signal (indicating a gain setting in steps, e.g. from GC=0 to GC=31). The larger the input signal level, the smaller gain is necessary in the variable amplifier and vice versa. The gain control output is—in addition to the variable gain unit—fed to a processing unit. If the gain control signal is below a predefined value (e.g. GC≤2) corresponding to a relatively low gain setting of the variable amplifier, e.g. and thus a relatively strong input signal), the receiving antenna is (increasingly, e.g. in one or more steps) de-tuned to lower the signal strength. Correspondingly, if the gain control signal is above a predefined value (e.g. GC≥27) corresponding to a relatively high gain setting of the variable amplifier and thus a relatively weak input signal), the tuning of the receiving antenna is improved (e.g. in one or more steps) to increase the signal strength.

The problem is particularly relevant in a system comprising a portable, battery driven receiver with restrictive requirements to power consumption (including a low battery voltage and a low battery capacity). An example of such a system is an audio system comprising a (possibly portable) wireless transmitter and a listening device comprising a wireless receiver, in particular wherein the communication link between transmitter and receiver is based on inductive communication. Such system, based on an inductive communication link, has the potential of providing a relatively low power consumption. The system, on the other hand, is also sensitive to the distance L between transmitter and receiver due to the $1/L^3$ dependence of the field strength and thus prone to saturation problems, when the two devices come close to each other. In this case a system according to the present disclosure is particularly valuable.

Figure 1:
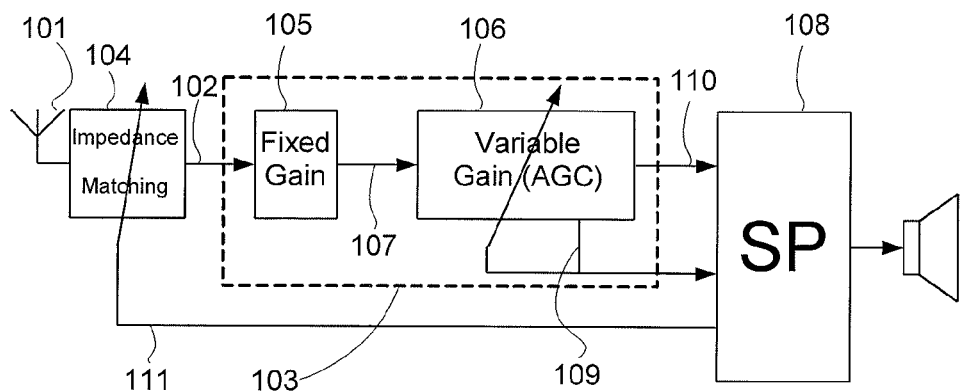
FIG. 1 shows an embodiment of a portable electronic device according to the present application.

FIG. 1 shows an embodiment of a portable electronic device according to the present application. The portable electronic device of FIG. 1, e.g. a listening device, e.g. a hearing instrument, comprises a wireless receiver unit for receiving a wireless signal from a transmitting device, the wireless receiver unit comprising an antenna (101) for receiving an electromagnetic signal and providing a received electric input signal (102), and a receiver (103) for providing a recovered electric signal from the received electric input signal, and an impedance matching circuit (104) for matching the electric impedance of the antenna (101) to the receiver (103). The receiver comprises a gain stage comprising a first, fixed (pre-amplifying) gain stage (105) and a second, variable gain stage (106). The fixed gain stage (105) amplifies an input signal (here received electric input signal 102) with a fixed gain value and provides an amplified output signal (107). The variable gain of the second stage (106) allows the receiver itself to set the gain to an appropriate value, ensuring the optimum signal level for the succeeding receiver or processing circuits (here signal processing unit 108). The variable gain stage, in the form of Automatic Gain Control unit (106), is adapted for automatically determining an AGC-gain value (also referred to as control signal 109) for application to an AGC-input signal (107) to provide an appropriate signal level of the recovered electric signal (110) when the level of said AGC input signal is in a range between a minimum signal level and a maximum signal level corresponding to maximum and minimum AGC-gain values, respectively. The portable electronic device further comprises a control unit (here signal processing unit 108) receiving the AGC-gain value (109) and providing an impedance matching control signal (111) to the impedance matching circuit (104)). The control unit (108) is adapted to change the impedance matching of the antenna (101) to the receiver (103) based on the AGC-gain value GC. In an embodiment, the fixed gain stage (105) is omitted. Typically, the gain stage (e.g. the AGC-unit) is only capable of amplifying an input signal, not to attenuate the signal (or not to attenuate it sufficiently, in order to avoid saturation of the gain stage).

Figure 2A:
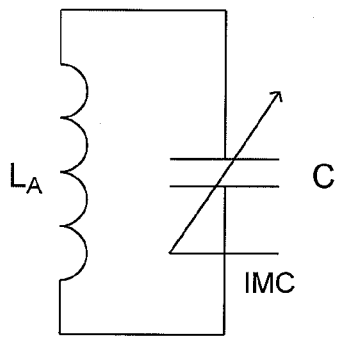
FIG. 2 shows two embodiments of an antenna and a variable impedance matching circuit.
Figure 2B:
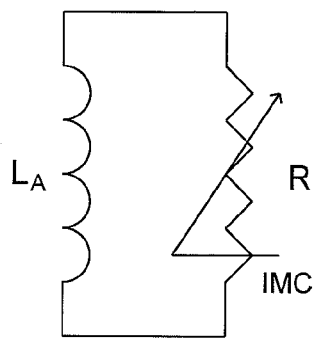

FIG. 2 shows two embodiments of an antenna and a variable impedance matching circuit. The antenna (101 in FIG. 1) is shown as an inductive coil with inductance ($L_A$). The impedance matching circuit (104 in FIG. 1) is shown as a variable capacitance (C, FIG. 2a) and a variable resistance (R, FIG. 2b), respectively. In both cases, the value of the impedance can be controlled by an impedance matching control signal (111) (provided by control unit 108 in FIG. 1) from a minimum value to a maximum value, preferably in a number of steps. Preferably, the minimum and maximum values are determined with a view to the antenna (101) impedance ($L_A$) and the receiver (103) input impedance. Alternatively, or additionally the inductance $L_A$ may be variable.

Figure 3A:
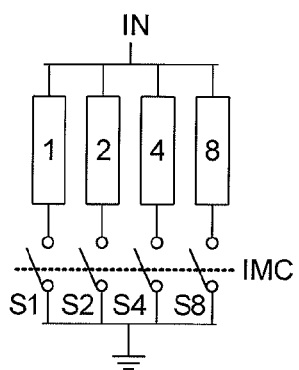
FIG. 3 shows two embodiments of a variable impedance matching circuit.
Figure 3B:
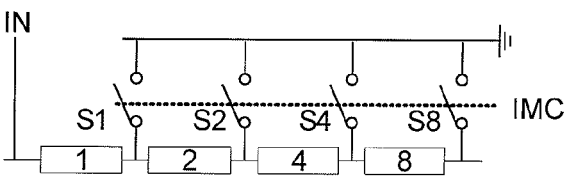

FIG. 3 shows two embodiments of a variable impedance matching circuit. FIG. 3a schematically illustrates an embodiment comprising a number of parallel components (e.g. resistors or capacitors or inductance coils, here four values are indicated, 1, 2, 4, 8) having different impedances, e.g. increasing values, e.g. mutually scaled as indicated by the numbers 1, 2, 4, 8. One or more of the impedances (1, 2, 4, 8) can be switched in the signal path coupling electric input signal 102 from the antenna 101 of FIG. 1 to ground by switches S1, S2, S4, S8 controlled by impedance matching control signal IMC 111 (generated by control unit (108) in FIG. 1). Similarly, FIG. 3b schematically illustrates an embodiment comprising a number of serially coupled components (e.g. resistors or capacitors or inductors, here four values are indicated, 1, 2, 4, 8) having different impedances, e.g. increasing values, e.g. mutually scaled as indicated by the numbers 1, 2, 4, 8. Thereby the impedance of the antenna can be matched (or de-matched) to the receiver input impedance in a number of steps.

Figure 4:
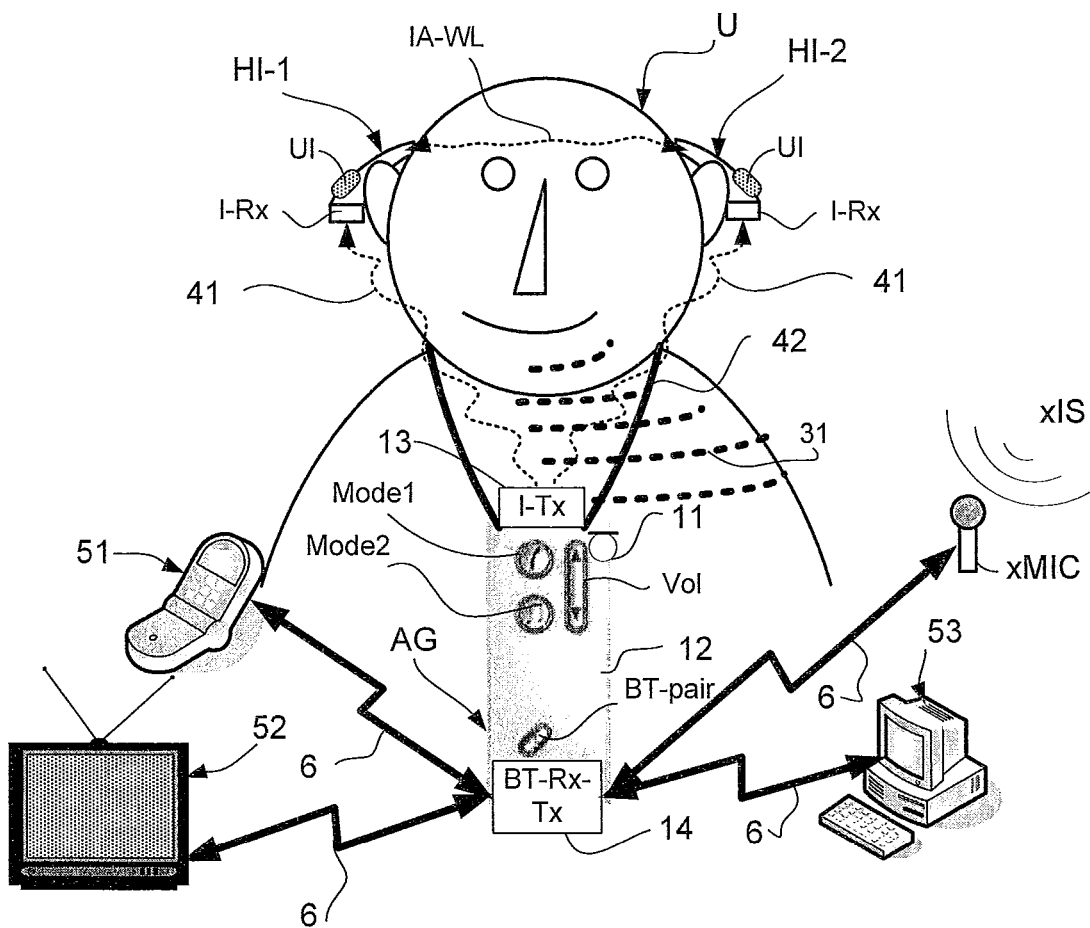
FIG. 4 shows a use scenario for a communication system according to the present application.

FIG. 4 shows a use scenario for a communication system according to the present application. FIG. 4 shows an application scenario of an embodiment of a portable listening system according to the present application comprising a pair of listening devices, in the form or a binaural hearing aid system comprising first and second hearing instruments (HI-1, HI-2), and an audio gateway device (AG), wherein the audio gateway device comprises an audio selection device adapted for receiving a multitude of audio signals (here shown from an entertainment device, e.g. a TV 52, a telephone apparatus, e.g. a mobile telephone 51, a computer, e.g. a PC 53, and an external microphone xMIC for picking up sounds xIS from the environment, e.g. the voice of another person). In the embodiment of FIG. 4, the microphone 11 of the audio gateway device is adapted for picking up the user's own voice 31 and capable of being connected to one or more of the external audio sources 51, 52, 53, xMIC via wireless links 6, here in the form of digital transmission links according to the Bluetooth standard as indicated by the Bluetooth transceiver 14 (BT-Tx-Rx) in the audio gateway device 1. The audio sources and the audio gateway device may be paired using the button BT-pair. The links may alternatively be implemented in any other convenient wireless and/or wired manner, and according to any appropriate modulation type or transmission standard, possibly different for different audio sources. Other audio sources than the ones shown in FIG. 4 may be connectable to the audio gateway, e.g. an audio delivery device (such as a music player or the like). The intended mode of operation of the listening system can be selected by the user via mode selection buttons Mode1 and Mode2. The audio gateway device may further have the function of a remote control of the listening device, e.g. for changing program or operating parameters (e.g. volume, cf. Vol-button) in the listening device.

The hearing instruments (HI-1, HI-2) are adapted for being mounted at the left and right ears, respectively, of a user (U). Each hearing instrument of the embodiment of FIG. 4 comprises a wireless transceiver for establishing a link to the audio gateway device (AG) (and/or a remote control device), here indicated to be based on inductive communication (I-Rx). The transceiver (at least) comprises an inductive receiver (i.e. an inductive coil, which is inductively coupled to a corresponding coil in a transceiver (I-Tx) of the audio gateway device AG), which is adapted to receive a wireless signal (e.g. comprising an audio signal and/or control signals) from the audio gateway device (either as a baseband signal or as a modulated (analogue or digital) signal, and in the latter case to extract the audio signal from the modulated signal). The hearing instruments (HI-1, HI-2) each comprises an antenna, an impedance matching circuit, a receiver and a control unit as described in connection with FIG. 1 above. Thereby an increased flexibility in the location of the audio gateway device (AG) relative to the hearing instruments (HI-1, HI-2) is provided.

The inductive link 41 between the audio gateway device and the hearing instruments is indicated to be one-way, but may alternatively be two-way (e.g. to be able to exchange control signals between transmitting (AG) and receiving (HI-1, HI-2) device, e.g. to agree on an appropriate transmission channel). Alternatively or additionally, the hearing instruments (and/or the audio gateway device) may be adapted to receive an audio signal from a telecoil (T-coil) in the environment of the device.

The hearing instruments (HI-1, HI-2) each comprise a selector/mixer unit (SEL/MIX) for selecting either of an input audio signal from a microphone of the instrument or the input signal from the wireless receiver unit (I-Rx) or a mixture thereof, providing as an output a resulting input signal. In an embodiment, the selector/mixer unit can be controlled by the user via the user interface (UI).

The audio gateway device (AG) is shown to be carried around the neck of the user (U) in a neck-strap 42. The neck-strap 42 may have the combined function of a carrying strap and a loop antenna into which the audio signal from the audio gateway device is fed for better inductive coupling to the inductive transceiver of the listening device. An audio selection device, which may be modified and used according to the present invention is e.g. described in EP 1 460 769 A1, EP 1 981 253 A1 and in WO 2009/135872 A1.

Figure 5:
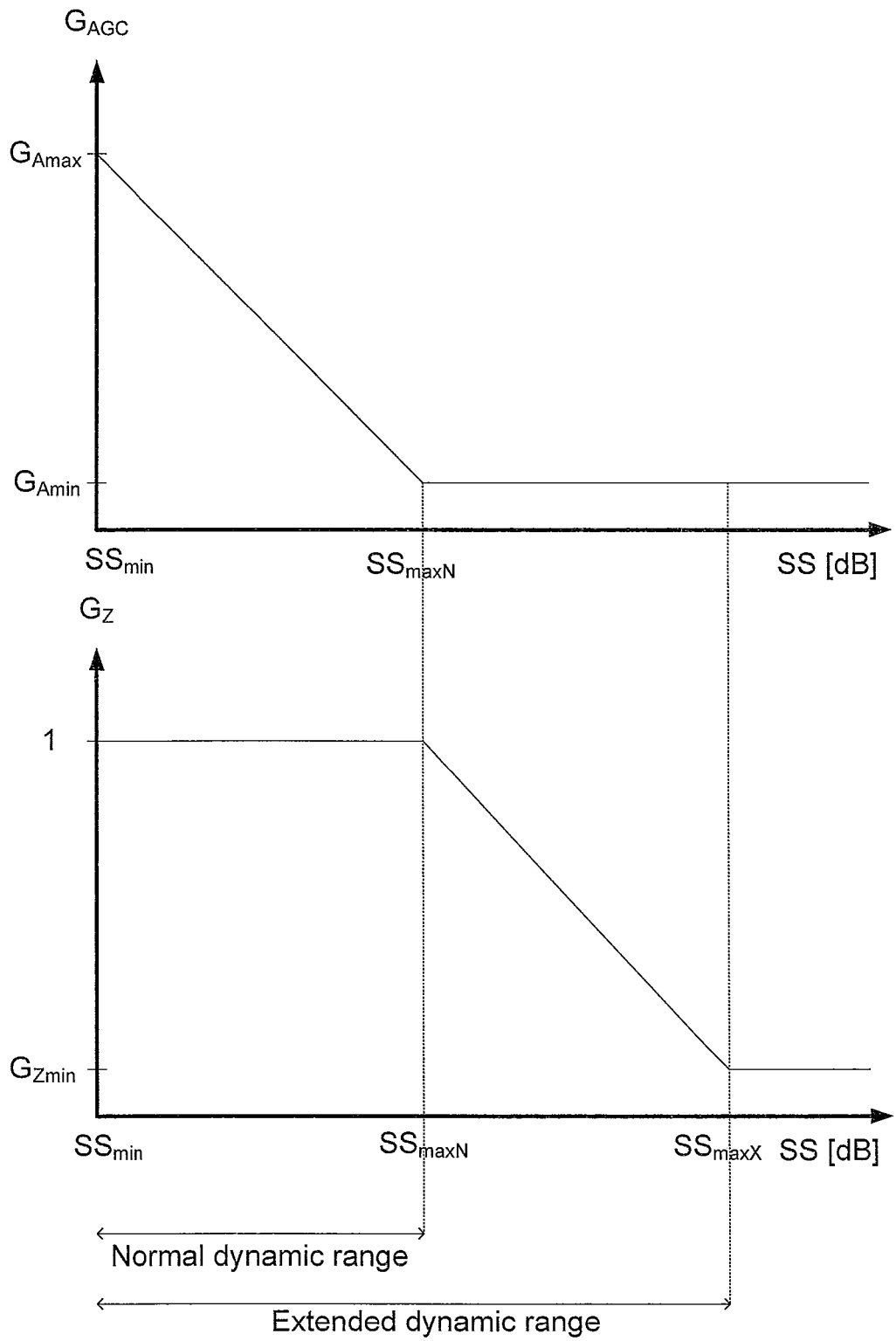
FIG. 5 illustrates an example of the effect on dynamic range of the application of a variable impedance matching circuit according to the present disclosure.

FIG. 5 illustrates an example of the effect on dynamic range of a signal received by an antenna by the application of a variable impedance matching circuit (104 in FIG. 1) according to the present disclosure. The 'Normal dynamic range' between a minimum signal strength (SS) level, $SS_{min}$, and a maximum signal strength level, $SS_{maxN}$, of a gain stage comprising an AGC unit is illustrated in the lower part of FIG. 5 next to the 'Extended dynamic range' of the same gain stage comprising an impedance matching circuit controllable according to the present disclosure. The top graph of FIG. 5 illustrates a schematic example of the variation of gain $G_A$ of an AGC unit with increasing signal strength (input level, SS in [dB]) of the input signal to the AGC unit (e.g. received from the antenna). The gain decreases from a maximum value ($G_{Amax}$) to a minimum value ($G_{Amin}$). When the signal strength of the input signal to the AGC increases beyond $SS_{maxN}$ (corresponding to the upper level of the normal dynamic range and a gain of $G_{Amin}$ of the AGC unit) $G_A$ cannot be lowered further. A gain stage without the variable impedance matching circuit according to the present disclosure (to attenuate the input signal to the gain stage from the antenna) would be saturated for antenna signal strengths larger than $SS_{maxN}$. According to the present disclosure the variable impedance matching circuit may increase the normal dynamic range ($S_{min}$ to $SS_{maxN}$) to an extended dynamic range ($S_{min}$ to $SS_{maxX}$) by decreasing the degree of match of the impedance matching circuit between the antenna and the receiver, thereby decreasing the input signal from the antenna to the gain stage as illustrated in the bottom graph of FIG. 5. Thereby the antenna signal is allowed a larger dynamic range, while still being appropriately handled by the gain stage. The gain (attenuation) $G_Z$ of the impedance matching circuit is in the example of FIG. 5 shown to be variable between a maximum value ($G_{Zmax}$, here 1) and a minimum value $G_{Zmin}$, e.g. 0.01 (or larger). In an embodiment, the maximum value $G_{Zmax}$ is smaller than or equal to 1, e.g. in the range between 0.5 and 1. In an embodiment, the maximum value $G_{Amax}$ of the gain of the AGC of the gain stage is $10^5$. In an embodiment, the minimum value $G_{Amin}$ of the gain of the AGC of the gain stage is equal to 1. Alternatively the minimum value $G_{Amin}$ may be larger than 1 (e.g. larger than or equal to 100) or smaller than 1 (e.g. smaller than or equal to 0.01). In case, the gain stage comprises a first, fixed (pre-amplifying) gain stage, the minimum gain $G_{Amin}$ is typically determined by the fixed gain of such stage. In the example of FIG. 5, top graph, the variation of the gain $G_A$ of the AGC unit with input signal strength is shown to be linear on a logarithmic scale of the signal strength [dB]. This need not be the case. Any other functional dependence providing a decreasing gain G with increasing signal SS strength may be possible. The same is the case for the gain (attenuation) $G_Z$ of the impedance matching circuit illustrated in the bottom graph of FIG. 5.

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims.

REFERENCES

EP 2 211 579 A1 (OTICON)
[Schaub; 2008] Arthur Schaub, Digital hearing Aids, Thieme Medical. Pub., 2008.
WO 03/081947 A1 (OTICON)
U.S. Pat. No. 5,144,675 (ETYMOTIC)
EP 1 460 769 A1 (PHONAK)
EP 1 981 253 A1 (OTICON)
WO 2009/135872 A1 (OTICON)
US 2009/0130991 A1 (BROADCOM CORPORATION)
US 2004/0080372 A1 (FARADAY TECH CORP)

The invention claimed is:

1. A portable electronic device, comprising:
a wireless receiver unit for receiving a wireless signal from a transmitting device, the wireless receiver unit including
an antenna for receiving an electromagnetic signal and providing a received electric input signal, and
a receiver for providing a recovered electric signal from the received electric input signal; and
an impedance matching circuit for matching an electric impedance of the antenna to the receiver, wherein
the receiver includes a gain stage, the gain stage including
a variable gain stage in the form of an Automatic Gain Control unit for automatically determining an AGC-gain value for application to an AGC-input signal to provide an appropriate signal level of the recovered electric signal when the level of said AGC-input signal is in a range between a predetermined minimum signal level and a predetermined maximum signal level corresponding to maximum and minimum AGC-gain values, respectively,
the gain stage is configured to amplify the received electric input signal, but not to attenuate the received electric input signal,
the portable electronic device further includes
a control unit receiving said AGC-gain value and providing an impedance matching control signal depending on said AGC-gain value to said impedance matching circuit,
the control unit is configured to change the impedance matching of the antenna to the receiver by supplying the impedance matching control signal to the impedance matching circuit, and
the control unit is further configured to decrease the impedance matching of the impedance matching circuit when said AGC-gain value is below a predefined minimum threshold AGC-gain value, thereby attenuating the received electric input signal when its level is larger than an upper limit of a dynamic range of the gain stage.

2. A portable electronic device according to claim 1 wherein the control unit is adapted to increase the impedance matching of the impedance matching circuit when said AGC-gain value is above a predefined maximum threshold AGC-gain value.

3. A portable electronic device according to claim 1 wherein
the Automatic Gain Control unit is adapted to provide said AGC-gain values in steps between a minimum and a maximum value.

4. A portable electronic device according to claim 1 wherein the impedance matching circuit comprises one or more of a variable capacitance, a variable resistance and a variable inductance.

5. A portable electronic device according to claim 1, wherein the antenna comprises a coil.

6. A portable electronic device according to claim 5, wherein
the antenna comprises a coil, and
the coil of the antenna is part of an inductive link based on inductive coupling between an antenna coil of the transmitting device and said coil of the antenna.

7. A portable electronic device according to claim 1, wherein the antenna comprises a patch.

8. A portable electronic device according to claim 1 adapted to provide that the change of the impedance matching of the antenna to the receiver is performed in one or more steps controlled by said control signal from the control unit.

9. A portable electronic device according to any one of claims 1 and 3-8, wherein
the gain stage further comprises a fixed gain stage.

10. A portable electronic device according to claim 1, comprising a hearing aid.

11. A communication system comprising a portable electronic device according to claim 1 and a transmitting device, the portable electronic device and the transmitting device being adapted to establish a wireless link between them at least allowing a signal to be transmitted from the transmitting device to the portable electronic device.

12. A communication system according to claim 11, wherein
the wireless link is based on inductive coupling between respective antenna coils of the transmitting device and the portable electronic device.

13. A communication system according to claim 11, wherein
the transmitting device is one of
an audio gateway device,
an entertainment device, and
a listening device, and
wherein the system is configured to transmit and receive audio via the wireless link.

14. A communication system according to claim 11, further comprising
a first listening device, wherein
the portable electronic device is a second listening device, and
the first and second listening devices are configured to implement a binaural listening system.

15. A communication system according to claim 14, wherein
the binaural listening system is a binaural hearing aid system.

16. A method of operating a wireless receiver unit for receiving a wireless signal from a transmitting device, wherein the wireless receiver unit includes an antenna for receiving an electromagnetic signal and providing a received electric input signal, a receiver for providing a recovered electric signal from the received electric input signal, and an impedance matching circuit for matching an electric impedance of the antenna to the receiver, the method comprising:
automatically determining an AGC-gain value in the receiver for application to an AGC-input signal to provide amplification but not attenuation of the recovered electric signal when the level of said AGC-input signal is in a range between a predetermined minimum signal level and a predetermined maximum signal level corresponding to maximum and minimum AGC-gain values, respectively; and
changing the impedance matching of the antenna to the receiver in the impedance matching circuit based on the AGC-gain value, wherein
the changing the impedance matching includes
decreasing the impedance matching of the antenna to the receiver when said AGC-gain value is below a predefined minimum threshold AGC-gain value, thereby attenuating the received electric input signal when its level is larger than an upper limit of a dynamic range of a gain stage of the wireless receiver unit.

17. A tangible computer-readable medium storing a computer program comprising program code means for causing a data processing system to perform the steps of the method of claim 16, when said computer program is executed on the data processing system.

* * * * *